(12) United States Patent
Kwag

(10) Patent No.: US 11,342,366 B2
(45) Date of Patent: May 24, 2022

(54) IMAGE SENSING DEVICE

(71) Applicant: SK hynix Inc., Icheon-si (KR)

(72) Inventor: Pyong Su Kwag, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 8 days.

(21) Appl. No.: 16/952,491

(22) Filed: Nov. 19, 2020

(65) Prior Publication Data

US 2021/0313363 A1 Oct. 7, 2021

(30) Foreign Application Priority Data

Apr. 7, 2020 (KR) .................... 10-2020-0042090

(51) Int. Cl.
*H01L 27/146* (2006.01)
*H04N 5/357* (2011.01)
*H01L 27/148* (2006.01)

(52) U.S. Cl.
CPC .. *H01L 27/14612* (2013.01); *H01L 27/14831* (2013.01); *H04N 5/3575* (2013.01)

(58) Field of Classification Search
CPC ......... H01L 27/14612; H01L 27/14831; H01L 27/14609; H04N 5/3575; H04N 5/3559; H04N 5/3658; H04N 5/3741; H04N 5/37452; H04N 5/357
See application file for complete search history.

(56) References Cited

U.S. PATENT DOCUMENTS

| | | | |
|---|---|---|---|
| 9,300,886 B2 | 3/2016 | Yamashita et al. | |
| 2010/0238336 A1* | 9/2010 | Okamoto | H04N 5/357 348/308 |
| 2014/0002701 A1* | 1/2014 | Koifman | H04N 5/363 348/294 |
| 2016/0155773 A1* | 6/2016 | Storm | H04N 5/355 257/225 |
| 2017/0208281 A1* | 7/2017 | Kwag | H01L 27/14643 |
| 2019/0222781 A1* | 7/2019 | Lim | H01L 27/14612 |
| 2021/0029316 A1* | 1/2021 | Lee | H04N 5/351 |

* cited by examiner

*Primary Examiner* — Shahbaz Nazrul
(74) *Attorney, Agent, or Firm* — Perkins Coie LLP

(57) ABSTRACT

An image sensing device may include: a plurality of pixels included in a first row; a first signal line configured to transfer a boosting voltage to the plurality of pixels; a first switch transistor coupled between the first signal line and a second signal line disposed adjacent to the top side of the first signal line; and a second switch transistor coupled between the first signal line and a third signal line disposed adjacent to the bottom side of the first signal line.

18 Claims, 4 Drawing Sheets

IMAGE SENSING DEVICE

PRIORITY CLAIM AND CROSS-REFERENCES TO RELATED APPLICATION

This patent document claims the priority and benefits of Korean application number 10-2020-0042090, filed on Apr. 7, 2020, which is incorporated herein by reference in its entirety.

TECHNICAL FIELD

The technology and implementations disclosed in this patent document generally relate to an image sensing device including pixels disposed adjacent to each other.

BACKGROUND

An image sensor is a device for capturing an image using the property of semiconductor that reacts to light that is incident thereon to produce an image. Recently, with the development of computer industry and communication industry, the demand for advanced image sensors has been increasing in various electronic devices such as smart phones, digital cameras, video game equipment, devices for use with IOT (Internet of Things), robots, security cameras and medical micro cameras.

The image sensors may be roughly divided into CCD (Charge Coupled Device) image sensors and CMOS (Complementary Metal Oxide Semiconductor) image sensors. CCD image sensors generate less noise and have better image quality than CMOS image sensors. However, CMOS image sensors have a simpler and more convenient driving scheme, and thus may be preferred in some applications. CMOS image sensors may integrate a signal processing circuit in a single chip, making it easy to miniaturize the sensors for implementation in a product, with the added benefit of consuming lower power consumption. CMOS image sensors can be fabricated using a CMOS fabrication technology, which results in low manufacturing cost. CMOS image sensing devices have been widely used due to their suitability for implementation in mobile devices.

SUMMARY

Various embodiments of the disclosed technology are related to an image sensing device capable of reducing noise which may be transferred between pixels disposed adjacent to each other.

In an embodiment, an image sensing device may include: a plurality of pixels included in a first row; a first signal line configured to transfer a boosting voltage to the plurality of pixels; a first switch transistor coupled between the first signal line and a second signal line disposed adjacent to the top side of the first signal line; and a second switch transistor coupled between the first signal line and a third signal line disposed adjacent to the bottom side of the first signal line.

In another aspect, an image sensing device is provided to comprise: a pixel array including pixels arranged in rows and columns, the pixels including first pixels disposed on a first row that is disposed between a second row and a third row, and second pixels disposed on the second row and third pixels disposed on the third row; a first signal line coupled to the first pixels and configured to apply a boosting voltage to the first pixels; a second signal line coupled to the second pixels; a first switch transistor coupled between the first signal line and the second signal line and structured to be turned on to couple the first signal line to the second signal line; and a second switch transistor coupled between the first signal line and a third signal line coupled to the third pixels disposed on the third row and structured to be turned on to couple the first signal line to the third signal line.

In an embodiment, an image sensing device may include: a plurality of pixels arranged in an n×m matrix where n and m are integers equal to or larger than 2; a plurality of signal lines each configured to transfer a boosting voltage to pixels belonging to the same row, among the plurality of pixels; and a plurality of switch transistors each coupled between signal lines adjacent to each other, among the plurality of signal lines.

In another aspect, an image sensing device is provided to include a plurality of pixels arranged in an n×m matrix where n and m are integers equal to or larger than 2, each pixel including a photoelectric conversion element structured to generate photocharges in response to light incident to the photoelectric conversion element and a floating diffusion region electrically coupled to the photoelectric conversion element and store the generated photocharges; a plurality of signal lines, each configured to apply a boosting voltage to corresponding pixels disposed on a corresponding row to raise voltage levels of floating diffusion regions of the corresponding pixels; and a plurality of switch transistors, each coupled between any two adjacent signal lines and structured to be turned on or off to transfer a noise component occurring on some pixels disposed on a corresponding row to another row.

In accordance with some embodiments of the disclosed technology, it is possible to minimize banding noise between pixels belonging to a same row.

DETAILED DESCRIPTION

Hereafter, various embodiments will be described with reference to the accompanying drawings. However, it should be understood that the present disclosure is not limited to specific embodiments, but various modifications, equivalents and/or alternatives of the embodiments can be made.

Figure 1:
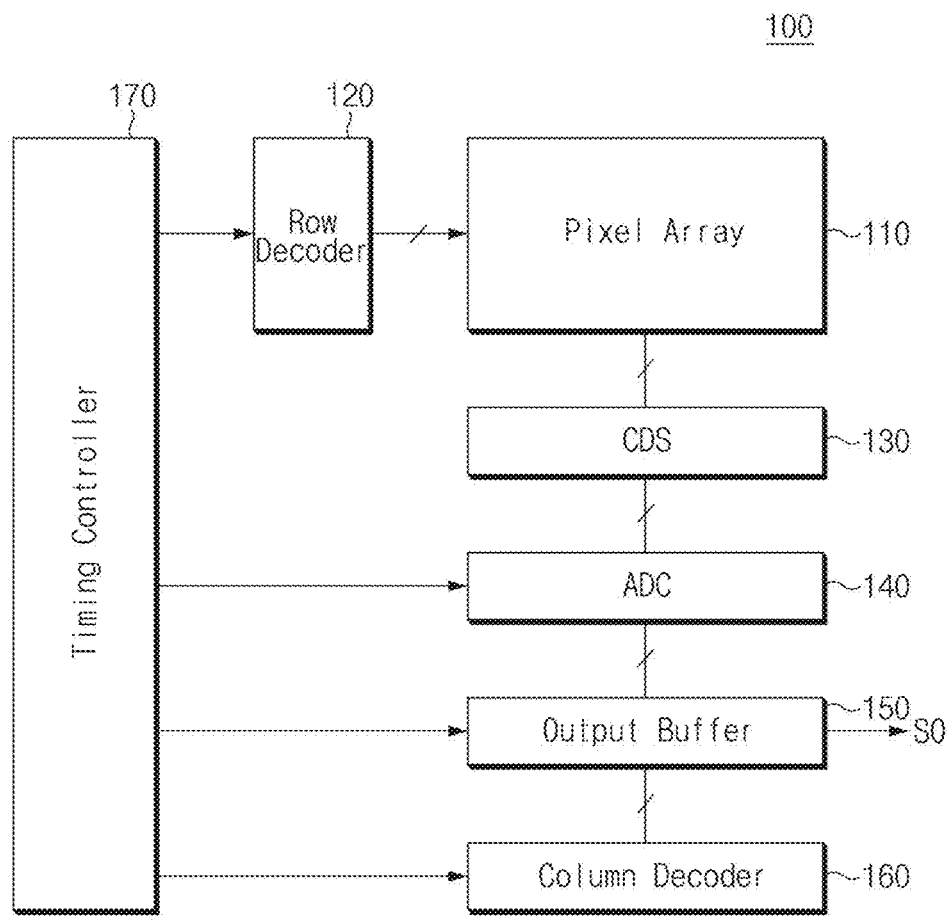
FIG. 1 is a block diagram illustrating an example of an image sensor in accordance with an embodiment of the disclosed technology.

FIG. 1 is a block diagram illustrating an image sensor in accordance with an embodiment.

Referring to FIG. 1, the image sensor 100 is a CMOS image sensor, and may be referred to as an image sensing device. The image sensor 100 may include a pixel array 110, a row decoder 120, a CDS (Correlated Double Sampler) 130, an ADC (Analog-Digital Converter) 140, an output buffer 150, a column decoder 160 and a timing controller 170. The components of the image sensor 100 are only an example, and at least some components may be added or omitted, if necessary.

The pixel array 110 may include a plurality of unit pixels arranged in a two dimensional manner, e.g., in rows and columns. The plurality of unit pixels may convert an optical signal into an electrical signal. The conversion from the optical signal to the electrical signal can be performed in each unit pixel or in a shared pixel structure including two or more unit pixels which share one or more dements. Each of the unit pixels or the shared pixel structure may correspond to a 3T pixel, 4T pixel or 5T pixel, but the present embodiment is not limited thereto. The shared pixel structure may correspond to 4-shared pixels which include four unit pixels sharing one or more dements or 8-shared pixels which include eight unit pixels sharing one or more elements, but the present embodiment is not limited thereto. The pixel array 110 may receive, from the row decoder, a driving signal that includes a row selection signal, a pixel reset signal and a transmission signal. The pixel array 110 may operate based on the driving signal.

The row decoder 120 may drive the pixel array 110 in response to a signal from the timing controller 170. For example, the row decoder 120 may select one or more rows of the pixel array 110. The row decoder 120 may generate a row selection signal to select one or more rows among the plurality of rows. The row decoder 120 may sequentially enable the pixel reset signal and the transmission signal for pixels corresponding to the selected one or more row. Thus, reference signals and image signals, which are analog signals generated from the pixels of the selected one or more rows, may be sequentially transferred to the CDS 130. The reference signal and the image signal may be collectively referred to as a pixel signal.

CMOS image sensors may use the correlated double sampling (CDS) to remove an undesired offset value of pixels by sampling a pixel signal twice to remove the difference between these two samples. In one example, the correlated double sampling (CDS) may remove the undesired offset value of pixels by comparing pixel output voltages obtained before and after a light signal is incident on the pixels so that only pixel output voltages based on the incident light can be measured. In some embodiments of the disclosed technology, the CDS 130 may sequentially sample and hold the reference signals and the image signals, which are provided to a plurality of column lines from the pixel array 110, respectively. That is, the CDS 130 may sample and hold the levels of the reference signals and the image signals which correspond to the respective columns of the pixel array 110.

The CDS 130 may transfer the reference signal and the image signal of each of the columns as a CDS (Correlated Double Sampling) signal to the ADC 140 under control of the timing controller 170.

The ADC 140 may convert the CDS signal for each of the columns, outputted from the CDS 130, into a digital signal and output the digital signal. The ADC 140 may perform a counting operation and a computing operation based on the CDS signal for each of the columns and a ramp signal provided from the timing controller 170, and thus generate digital image data from which noise corresponding to each of the columns, for example, unique reset noise of each pixel, has been removed.

The ADC 140 may include a plurality of column counters corresponding to the respective columns of the pixel array 110, and generate the image data by converting the CDS signals corresponding to the respective columns into digital signals using the column counters. According to another embodiment, the ADC 140 may include one global counter, and convert the CDS signals corresponding to the respective columns into digital signals using a global code provided from the global counter.

The output buffer 150 may capture the column-based image data provided from the ADC 140, and output the captured image data. The output buffer 150 may temporarily store the image data outputted from the ADC 140 under control of the timing controller 170. The output buffer 150 may operate as an interface which compensates for a difference in transfer or processing speed between the image sensor 100 and another device coupled to the image sensor 100.

The column decoder 160 may select a column of the output buffer 150 under control of the timing controller 170, and sequentially output the image data which are temporarily stored in the selected column of the output buffer 150. For example, the column decoder 160 may receive an address signal from the timing controller 170, generate a column selection signal based on the address signal, and select a column of the output buffer 150, such that the image data are outputted as an output signal SO from the selected column of the output buffer 150.

The timing controller 170 may control the row decoder 120, the ADC 140, the output buffer 150 and the column decoder 160.

The timing controller 170 may provide the row decoder 120, the column decoder 160 and the output buffer 150 with a dock signal required for operations of the respective components of the image sensor 100, a control signal for timing control, and address signals for selecting a row or column. According to an embodiment, the timing controller 170 may include a logic control circuit, a phase locked loop (PLL) circuit, a timing control circuit, a communication interface circuit and the like.

Figure 2:
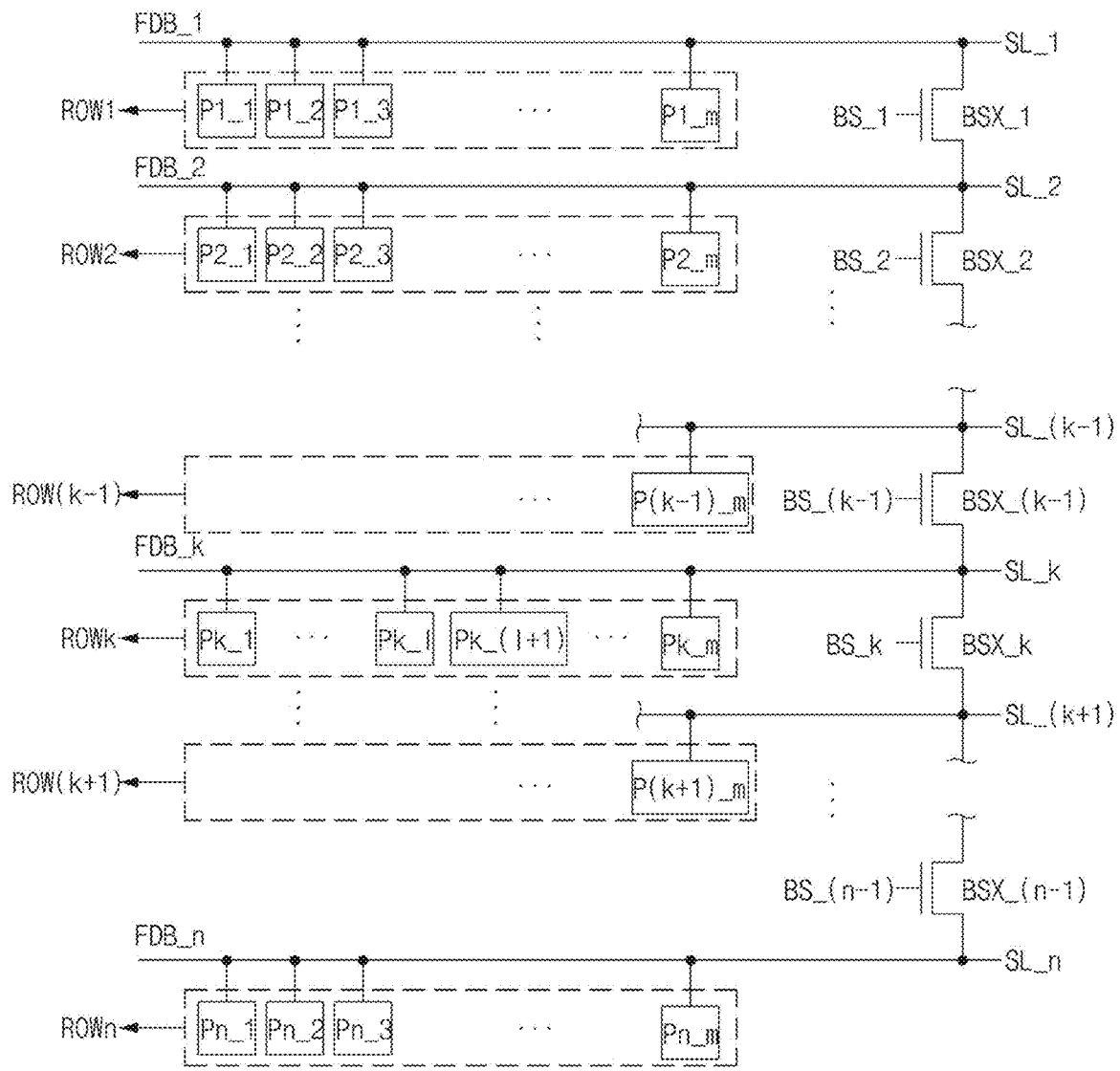
FIG. 2 is a diagram illustrating an example of a pixel array of FIG. 1.

FIG. 2 is an example of a diagram illustrating the pixel array of FIG. 1.

Referring to FIG. 2, a pixel array 200 may include a plurality of pixels arranged in an n×m matrix including n rows and m columns, where n and m are integers equal to or more than 2. Each pixel included in the pixel array 200 is represented in a form of Px_y, where x and y are integers equal to or greater than 1 and respectively correspond to a row number and a column number of a corresponding pixel. For example, P2_3 represents a pixel which is included in the second row and the third column.

Each of the pixels (Px_y) may sense incident light. In response to a reception of the incident light, each pixel (Px_y) generates photocharges corresponding to the intensity of the incident light, accumulate the generated photocharges in a sensing node referred to as a floating diffusion region, and converts the voltage level of the photocharges stored in the floating diffusion region into an electrical signal. As the pixels are reduced in size, an area which can be occupied by each of the pixels Px_y is reduced, and the area of the floating diffusion region implemented as a junction capacitor is also reduced, which may make it difficult for the floating diffusion region to secure capacitance that is not less than a predetermined value. If the floating diffusion region has capacitance less than the predetermined value, when the intensity of incident light is relatively high, the floating diffusion region may be easily saturated, which makes a dynamic range small.

In order to solve such a problem, a boosting capacitor may be coupled to the floating diffusion region, and a boosting voltage may be applied to temporarily raise the voltage level of the floating diffusion region. In some implementations, each of the pixels Px_y may include such a boosting capacitor, and receive the boosting voltage. The boosting voltage may be a voltage which is provided by the row decoder 120 of FIG. 1, and adjusts the voltage level of the floating diffusion region.

First, referring to a first row ROW1, the first row ROW1 may include m pixels P1_1 to P1_m. The pixels P1_1 to P1_m may be coupled to the same first signal line SL_1 in order to receive a boosting voltage FDB_1.

Similarly, in a second row ROW2, m pixels (P2_1 to P2_m) may be coupled to the same signal line (SL_2), and receive the same boosting voltage (for example, FDB_2). In this manner, a plurality of pixels included in each of the remaining rows may be coupled to a corresponding signal line to receive a corresponding boosting voltage.

When photocharges are transferred to a floating diffusion region of a certain pixel included in a specific row, the voltage of the floating diffusion region included in the certain pixel may be changed. Such a voltage change occurring in the certain pixel may have an influence on the voltage level of the floating diffusion region of another pixel coupled to the same signal line as the certain pixel. This is because capacitive coupling occurs between the floating diffusion regions of pixels that are coupled to the same signal line. Since the boosting capacitors coupled to the respective floating diffusion regions are coupled to one signal line and have relatively high capacitance, higher capacitive coupling may occur between the floating diffusion regions. Such capacitive coupling may change the voltage of the floating diffusion region of any one pixel, and the voltage change may change the voltage of the floating diffusion region of another pixel coupled to the same signal line, thereby generating noise. Such noise is referred to as banding noise.

For example, suppose that a first pixel and a second pixel are coupled to a same signal line, a specific intensity of incident light is incident on the first pixel, and no incident light is incident on the second pixel. In this case, a pixel signal of the first pixel should have a level corresponding to the specific intensity, and a pixel signal of the second pixel should have a level corresponding to zero incident light. However, when the voltage level of the floating diffusion region of the first pixel is changed, the voltage of the floating diffusion region of the second pixel may be influenced and changed by capacitive coupling between the first and second pixels. Thus, the floating diffusion region of the second pixel may have a voltage level corresponding to a predetermined intensity, not a level corresponding to zero incident light.

In order to minimize such banding noise, the pixel array 200 in accordance with the present embodiment may include one or more switch transistors BSX_1 to BSX_(n−1). In the present embodiment, the switch transistors BSX_1 to BSX_(n−1) are described as an example only. For example, the switch transistors BSX_1 to BSX_(n−1) may be replaced with a different type of switching elements which can perform switching operations.

Each of the switch transistors BSX_1 to BSX_(n−1) may be coupled between signal lines (for example, SL_1 and SL_2) that are disposed adjacent to each other. The switch transistors BSX_1 to BSX_(n−1) may be turned on or off in response to banding switch control signals BS_1 to BS_(n−1), respectively. The banding switch control signals BS_1 to BS_(n−1) may be provided from the row decoder 120 of FIG. 1.

When the switch transistors BSX_1 to BSX_(n−1) are turned off, the signal lines which are adjacent to each other and to which corresponding one of the switch transistors BSX_1 to BSX_(n−1) is coupled may be electrically opened. On the other hand, when the switch transistors BSX_1 to BSX_(n−1) are turned on, the signal lines which are adjacent to each other and to which corresponding one of the switch transistors BSX_1 to BSX_(n−1) is coupled may be electrically shorted.

FIG. 2 illustrates that each of the switch transistors BSX_1 to BSX_(n−1) is disposed on the right side of a corresponding pixel (for example, P1_m) located in the rightmost side of each of the rows, but the present embodiment is not limited thereto. For example, each of the switch transistors BSX_1 to BSX_(n−1) may be disposed on the left side of a corresponding pixel (for example, P1_1) located in the leftmost side of each of the rows, or disposed on one side of a certain pixel located between the leftmost and the rightmost sides of each of the rows. Although FIG. 2 shows that the switch transistors BSX_1 to BSX_(n−1) are disposed along a straight line parallel to a column direction, the switch transistors BSX_1 to BSX_(n−1) may not be disposed in a line parallel to the column direction. In some implementations, two switch transistors may be disposed to be adjacent to two different columns.

A $k^{th}$ row ROWk including pixels pk_1 to pk_m, which is illustrated in FIG. 2, will be described in more detail as an example, where k is any one of 1 to n. In some implementations, each of the switch transistors BSX_1 to BSX_(n−1) may be turned on during a time interval in which capacitive coupling may occur between any two of the plurality of pixels Pk_1 to Pk_m. Thus, a $k^{th}$ signal line SL_k coupled to the boosting capacitors of the plurality of pixels Pk_1 to Pk_m may be also electrically coupled to other signal lines SL_1 to SL_(k−1) and SL_(k+1) to SL_n. Noise components caused by the capacitive coupling between any two of the plurality of pixels Pk_1 to Pk_m may be transferred through the $k^{th}$ signal line SL_k to other signal lines SL_1 to SL_(k−1) and SL_(k+1) to SL_n as well that are electrically coupled to the $k^{th}$ signal line SL_k. Thus, the noise components can be distributed through other signal lines SL_1 to SL_(k−1) and SL_(k+1) to SL_n, which makes it possible to minimize the occurrence of banding noise.

In some implementations, during the time interval in which capacitive coupling may occur between any two of the plurality of pixels Pk_1 to Pk_m, only some of the switch transistors BSX_1 to BSX_(n−1) may be turned on. This is different from the previous implementation that all of the switch transistors BSX_1 to BSX_(n−1) may be turned on during the time interval. The switch transistors to be turned on among the switch transistors BSX_1 to BSX_(n−1) may be determined based on various manners. For example, the switch transistors BSX_1 to BSX_(k−1) that are disposed on first to (k−1) rows may be turned on during the time interval in which capacitive coupling may occur between any two of the plurality of pixels Pk_1 to Pk_m. In another example, the switch transistors BSX_k to BSX_(n−1) that are disposed on k to (n−1) rows may be turned on during the time interval in which capacitive coupling may occur between any two of the plurality of pixels Pk_1 to Pk_m. In another example, the switch transistors BSX_(k−1) and BSX_k which are directly coupled to the $k^{th}$ signal line SL_k may be turned on during the time interval in which capacitive coupling may occur between any two of the plurality of pixels Pk_1 to Pk_m. In the present embodiment, it has been described, as the example, that the switch transistors are turned on during the time interval in which capacitive coupling may occur between any two of the plurality of pixels Pk_1 to Pk_m. In some implementations, at least one of the switch transistors BSX_(k−1) and BSX_k directly coupled to the $k^{th}$ signal line SL_k is turned on. By turning on at least one of the switch transistors BSX_(k−1) and BSX_k that are directly coupled to the $k^{th}$ signal line SL_k, noise components that exist due to pixels on the $k^{th}$ row (ROWk) can be distributed to other signal lines as well through the at least one of the switch transistors BSX_(k−1) and BSX_k.

Hereafter, the operations of the pixels and the switch transistors will be described in more detail with reference to FIG. 3 and the following drawing. In the following descriptions, pixels Pk_l and Pk_(l+1), which are disposed on the $k^{th}$ row ROWk, will be discussed as examples.

Figure 3:
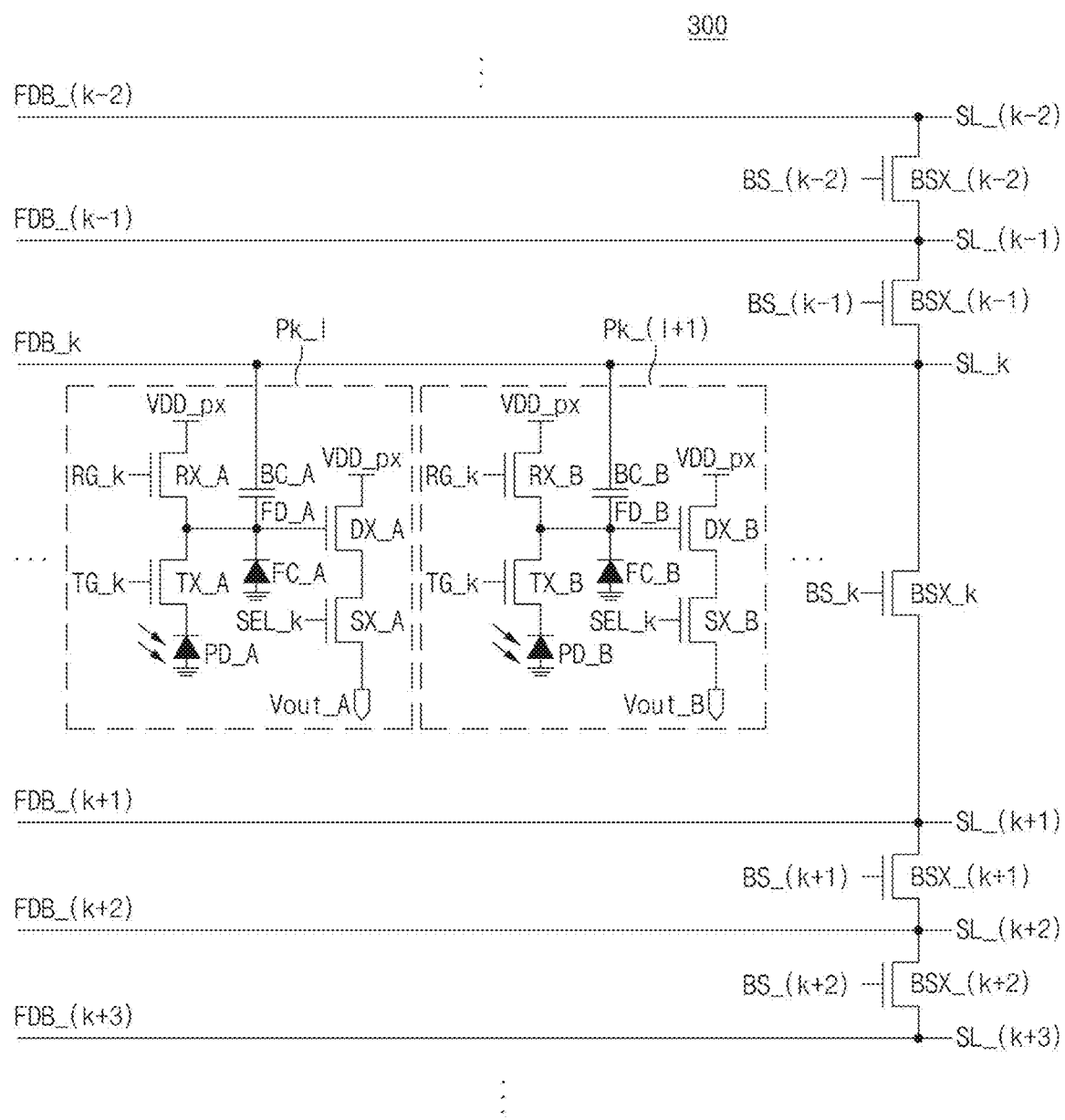
FIG. 3 is a diagram illustrating some pixels illustrated in FIG. 2 and some elements coupled thereto.

FIG. 3 is a diagram illustrating some pixels illustrated in FIG. 2 and some elements coupled thereto.

FIG. 3 illustrates a part 300 of the pixel array illustrated in FIG. 2. For example, FIG. 3 illustrates some pixels, Pk_l and Pk_(l+1), among the pixels illustrated in FIG. 2 and the switch transistors BSX_(k−2) to BSX_(k+2) coupled between the $k^{th}$ signal line SL_k coupling the pixels Pk_l and Pk_(l+1) and the signal lines SL_(k−2), SL_(K−1), SL_(k+1) and SL_(k+2) that are adjacent to the $k^{th}$ signal line SL_k.

In the following descriptions of the present embodiment, the $k^{th}$ row ROWk may be referred to as a first row, the $k^{th}$ signal line SL_k may be referred to as a first signal line, the $(k-1)^{th}$ signal line SL_(k−1) and the $(k+1)^{th}$ signal line SL_(k+1) may be referred to as a second signal line and a third signal line, respectively, and the $(k-1)^{th}$ switch transistor BSX_(k−1) and the $k^{th}$ switch transistor BSX_k may be referred to as a first switch transistor and a second switch transistor, respectively. Thus, the first row may include a plurality of pixels Pk_1 to Pk_m, the first signal line may transfer a boosting voltage FDB_k to the plurality of pixels Pk_1 to Pk_m, the first switch transistor BSX_(k−1) may be coupled between the first signal line and the second signal line disposed adjacent to the first signal line, and the second switch transistor BSX_k may be coupled between the first signal line and the third signal line disposed adjacent to the first signal line. In the example of FIG. 3, the second signal line and the third signal line are disposed above and below the first signal line, respectively.

The first pixel Pk_l may include a photoelectric conversion element PD_A, a transmission transistor TX_A, a reset transistor RX_A, a floating diffusion capacitor FC_A, a boosting capacitor BC_A, a drive transistor DX_A and a selection transistor SX_A.

The photoelectric conversion element PD_A may generate and accumulate photocharges corresponding to the intensity of incident light. For example, the photoelectric conversion element PD_A may be implemented as a photodiode, a pinned photodiode, a photo gate, a photo transistor or combinations thereof. One side of the photoelectric conversion element PD_A may receive a specific voltage (for example, ground voltage), and the other side of the photoelectric conversion element PD_A may be coupled to the transmission transistor TX_A.

The transmission transistor TX_A may be coupled between the photoelectric conversion element PD_A and a floating diffusion region F_DA, and turned on or off in response to a transmission control signal TG_K. When the transmission transistor TX_A is turned off, the transmission transistor TX_A may electrically isolate the photoelectric conversion element PD_A and the floating diffusion region FD_A from each other. When the transmission transistor TX_A is turned on, the transmission transistor TX_A may electrically couple the photoelectric conversion element PD_A and the floating diffusion region FD_A to each other, and thus transfer the photo-charges accumulated in the photoelectric conversion element PD_A to the floating diffusion region FD_A.

The reset transistor RX_A may be coupled between a pixel voltage VDD_px and the floating diffusion region FD_A, and turned on or off in response to the reset control signal RG_K. The pixel voltage VDD_px may be a supply voltage. When the reset transistor RX_A is turned off, the reset transistor RX_A may electrically isolate the pixel voltage VDD_px and the floating diffusion region FD_A from each other. When the reset transistor RX_A is turned on, the reset transistor RX_A may electrically couple the pixel voltage VDD_px and the floating diffusion region FD_A to each other, and thus reset the floating diffusion region FD_A to the supply voltage. When both of the reset transistor RX_A and the transmission transistor TX_A are turned on, the photoelectric conversion element PD_A as well as the floating diffusion region FD_A may be reset to the supply voltage through the reset transistor RX_A.

The floating diffusion capacitor FC_A may accumulate photocharges transferred through the transmission transistor TX_A. The floating diffusion capacitor FC_A may be implemented as a junction capacitor, but the present embodiment is not limited thereto. One side of the floating diffusion capacitor FC_A may be coupled to a specific voltage (for example, ground voltage), and the other side of the floating diffusion capacitor FC_A may be coupled to the floating diffusion region FD_A.

The boosting capacitor BC_A may be coupled between the $k^{th}$ signal line SL_k and the floating diffusion region FD_A, and increase the voltage level of the floating diffusion region FD_A based on the boosting voltage FDB_k transferred through the $k^{th}$ signal line SL_k. Thus, when the boosting voltage FDB_k applied to one side of the boosting capacitor BC_A transitions from a low level to a high level, the voltage level of the floating diffusion region FD_A coupled to the other side of the boosting capacitor BC_A follows the transition of the boosting voltage FDB_k and rises as well according to the coupling effect. On the other hand, when the boosting voltage FDB_k transitions from a high level to a low level, the voltage level of the floating diffusion region FD_A coupled to the other side of the boosting capacitor BC_A follows the transition of the boosting voltage FDB_k and falls as well according to the coupling effect. In the present embodiment, the state in which the boosting voltage FDB_k is at a high level is referred to as a boosting state, and the state in which the boosting voltage FDB_k is at a low level is referred to as a pre-boosting state. The low level and the high level may be referred to as a first level and a second level, respectively. For example, the boosting capacitor BC_A may be implemented as at least one of a junction capacitor, MIM (Metal-Insulator-Metal) capacitor, MOM (Metal-Oxide-Metal) capacitor, or MOS (Metal-Oxide-Semiconductor) capacitor.

The drive transistor DX_A may be coupled between the pixel voltage VDD_px and the selection transistor SX_A, and generate an electrical signal corresponding to the voltage level of the floating diffusion region FD_A coupled to a gate.

The selection transistor SX_A may be coupled between the drive transistor DX_A and an output line Vout_A, and turned on or off in response to a selection control signal SEL_k. When the selection transistor SX_A is turned off, the selection transistor SX_A may not transfer an electrical signal of the drive transistor DX_A to the output line Vout_A. When the selection transistor SX_A is turned on, the selection transistor SX_A may transfer the electrical signal of the drive transistor DX_A to the output line Vout_A. The output line Vout_A may be a line for transferring the pixel signal of the first pixel Pk_l to the outside (for example, the CDS 130), and the other pixels belonging to the same column as the first pixel Pk_l, i.e. the column l, may also be coupled the output line Vout_A and output pixel signals through the output line Vout_A.

The second pixel Pk_(I+1) may include a photoelectric conversion element PD_B, a transmission transistor TX_B, a reset transistor RX_B, a floating diffusion capacitor FC_B, a boosting capacitor BC_B, a drive transistor DX_B and a selection transistor SX_B. Since the second pixel Pk_(I+1) is configured and operated in substantially the same manner as the first pixel Pk_I described above, the detailed descriptions thereof are omitted herein. Furthermore, the other pixels included in the pixel array 200 may also be configured and operated in the substantially same manner as the first pixel Pk_I.

Since the second pixel Pk_(I+1) belongs to the same row as the first pixel Pk_I, the transmission control signal TG_K, the reset control signal RG_k, the boosting voltage FDB_k and the selection control signal SEL_k may be applied to the transmission transistor TX_B, the reset transistor RX_B, the boosting capacitor BC_B and the select transistor SX_B, respectively, as in the first pixel Pk_I. Thus, the photocharge transmitting operations, the reset operations, the boosting operations and the pixel signal output operations of the first and second pixels Pk_I and Pk_(I+1) may be simultaneously performed at the same timings.

For example, suppose that a specific intensity of incident light is incident on the first pixel Pk_I, and no incident light is incident on the second pixel Pk_(I+1). In this case, a pixel signal of the first pixel Pk_I should have a level corresponding to the specific intensity, and a pixel signal of the second pixel Pk_(I+1) should have a level corresponding to no incident light. However, when the voltage level of the floating diffusion region FD_A of the first pixel Pk_I is changed as the photo-charge transfer operation from the photoelectric conversion element to the floating diffusion region is performed in the first and second pixels Pk_I and Pk_(I+1) at the same time, capacitive coupling may occur between the floating diffusion regions FD_A and FD_B because the boosting capacitor BC_A coupled to the floating diffusion region FD_A and the boosting capacitor BC_B coupled to the floating diffusion region FD_B are coupled to the same $k^{th}$ signal line SL_k. Therefore, as the voltage of the floating diffusion region FD_B is influenced and changed by a change in voltage level of the floating diffusion region FD_A, the floating diffusion region FD_B may have a level corresponding to a predetermined intensity of light, not a level corresponding to zero incident light.

In the present embodiment, the first and second pixels Pk_I and Pk_(I+1) disposed adjacent to each other have been taken as an example for description. However, any pixel may transfer noise components to any other pixels coupled to the same signal line or belonging to the same row, according to capacitive coupling.

In accordance with the present embodiment, the switch transistors BSX_1 to BSX_(n-1) may be turned on during a time interval in which capacitive coupling may occur, for example, a time interval in which the photocharge transmission operation is performed. For example, the $k^{th}$ signal line SL_k for coupling the boosting capacitors of the plurality of pixels Pk_1 to Pk_m may be electrically coupled to the other signal lines SL_1 to SL_(k-1) and SL_(k+1) to SL_n. Therefore, the noise components caused by the capacitive coupling can be distributed through the other signal lines SL_1 to SL_(k-1) and SL_(k+1) to SL_n, which makes it possible to minimize the occurrence of banding noise.

Figure 4:
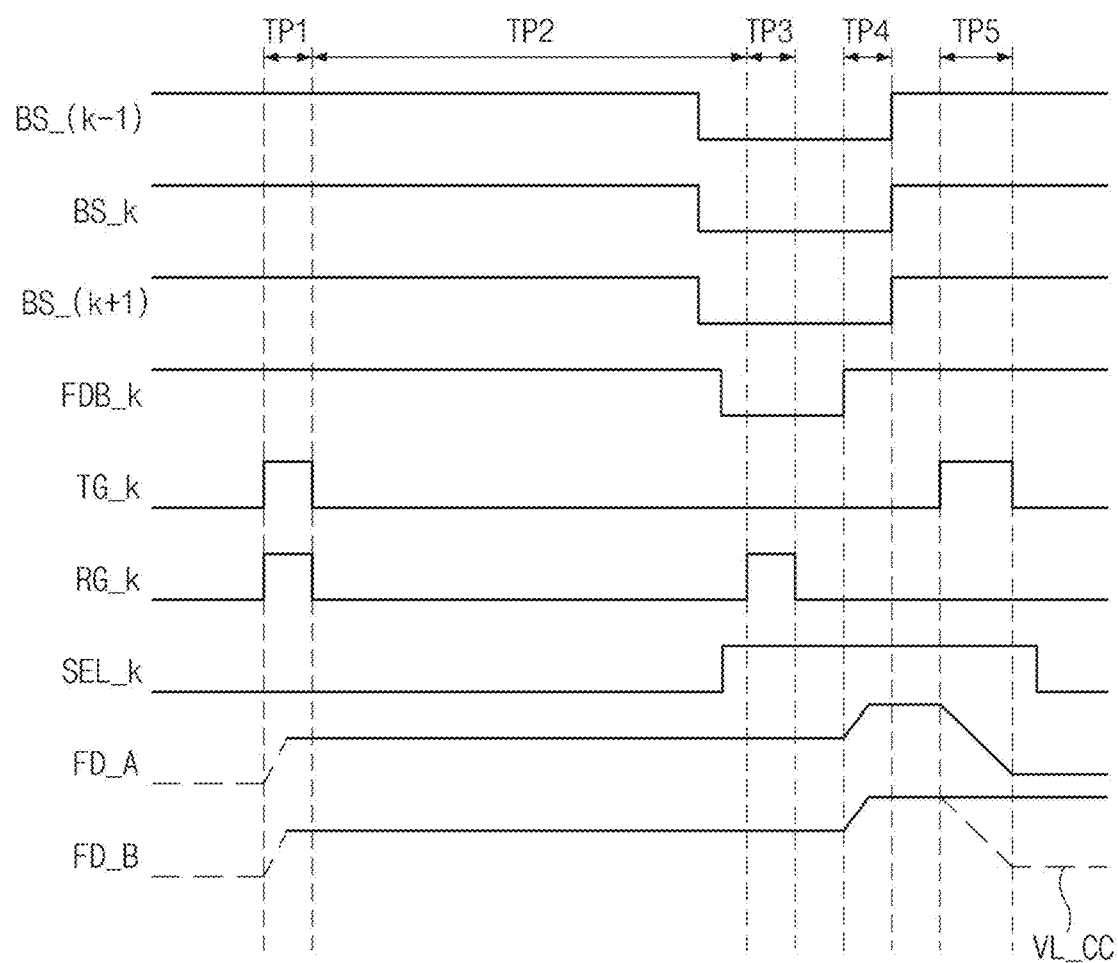
FIG. 4 is an example of a timing diagram that illustrates an operation of a part of a pixel array illustrated in FIG. 3.

FIG. 4 is a timing diagram for describing an operation of a part of the pixel array illustrated in FIG. 3.

FIG. 4 illustrates the operation of the part 300 of the pixel array in FIG. 3. Each of the control signals BS_(k-1), BS_k, BS_(k+1), TG_k, RG_k and SEL_k illustrated in FIG. 4 may have a logic high or logic low state. When each of the control signals BS_(k-1), BS_k, BS_(k+1), TG_k, RG_k and SEL_k is logic high, the corresponding transistor may be turned on. When each of the control signals BS_(k-1), BS_k, BS_(k+1), TG_k, RG_k and SEL_k is logic low, the corresponding transistor may be turned off.

The boosting voltage FDB_k may have a low level at which the voltage is relatively low and a high level at which the voltage is relatively high. Furthermore, each of the floating diffusion regions FD_A and FD_B may have a voltage level that is varied by an external influence (for example, reset, boosting, photo-charge transmission or the like).

The operations of the part 300 of the pixel array may be performed during first to fifth time periods TP1 to TP5. The lengths of the first to fifth time periods TP1 to TP5, which are illustrated in FIG. 4, are examples only and other implementations are also possible.

The first time period TP1 may be defined as a pixel reset period for removing photocharges remaining in the internal elements of the pixel.

In the first time period TP1, the banding switch control signals, BS_(k-1), BS_k and B_(k+1), may correspond to logic high, the boosting voltage FDB_k may correspond to a high level, the transmission control signal TG_k and the reset control signal RG_k may correspond to logic high, and the selection control signal SEL_k may correspond to logic low. Therefore, the switch transistors, BSX_(k-1), BSX_k and BSX_(k+1), may be turned on, the boosting capacitors BC_A and BC_B may be in the boosting state, the transmission transistors TX_A and TX_B and the reset transistors RX_A and RX_B may be turned on, and the selection transistors SX_A and SX_B may be turned off. As the transmission transistors TX_A and TX_B and the reset transistors RX_A and RX_B are turned on, the floating diffusion regions FD_A and FD_B and the photoelectric conversion elements PD_A and PD_B may be reset to the pixel voltage VDD_px.

The second time period TP2 may be defined as a photocharge accumulation period in which photocharges corresponding to the intensity of incident light are generated and accumulated by the photoelectric conversion element.

In the second time period TP2, the banding switch control signals, BS_(k-1), BS_k and BS_(k+1), may correspond to logic high, the boosting voltage FDB_k may correspond to a high level, and the transmission control signal TG_k, the reset control signal RG_k and the selection control signal SEL_k may correspond to logic low. Therefore, the switch transistors, BSX_(k-1), BSX_k and BSX_(k+1), may be turned on, the boosting capacitors BC_A and BC_B may be in the boosting state, the transmission transistors TX_A and TX_B, the reset transistors RX_A and RX_B and the selection transistors SX_A and SX_B may be turned off. With the transmission transistors TX_A and TX_B turned off, the photoelectric conversion elements PD_A and PD_B may generate and accumulate photocharges corresponding to the intensity of incident light. The second time period TP2 is defined as the photocharge accumulation period, but the photoelectric conversion elements PD_A and PD_B may still substantially generate and accumulate photocharges until the transmission transistors TX_A and TX_B are turned on or the fifth time period TP5 is started.

In the latter part of the second time period TP2, the boosting voltage FDB_k may transition from a high level to a low level. For the boosting operation on the floating diffusion regions FD_A and FD_B, the boosting voltage FDB_k needs to transition to a low level in advance (pre-boosting). That is because, when the boosting voltage FDB_k transitions to a low level after the floating diffusion regions FD_A and FD_B are reset in the third time period TP3, the voltage levels of the reset floating diffusion regions FD_A and FD_B follow the boosting voltage FDB_k and decrease to the low level. Therefore, an the latter part of the second time period TP2, the boosting voltage FDB_k may be controlled to transition from a high level to a low level in advance.

In the latter part of the second time period TP2, the banding switch control signals, BS_(k−1), BS_k and BS_(k+1), may transition from logic high to logic low, before the boosting voltage FDB_k transitions from a high level to a low level. This is because, when the $k^{th}$ signal line SL_k is coupled to another signal line, the pre-boosting operation and the boosting operation on the $k^{th}$ row cannot be normally performed using the boosting voltage FDB_k.

In the latter part of the second time period TP2, the selection control signal SEL_k may transition to logic high for a subsequent operation of generating and outputting a pixel signal.

In the third time period TP3, the banding switch control signals BS_(k−1), BS_k and BS_(k+1) may correspond to logic low, the boosting voltage FDB_k may correspond to a low level, the transmission control signal TG_k may correspond to logic low, and the reset control signal RG_k and the selection control signal SEL_k may correspond to logic high. Therefore, the switch transistors BSX_(k−1), BSX_k and BSX_(k+1) may be turned off, the boosting capacitors BC_A and BC_B may be in the pre-boosting state, the transmission transistors TX_A and TX_B may be turned off, and the reset transistors RX_A and RX_B and the selection transistors SX_A and SX_B may be turned on. As the reset transistors RX_A and RX_B are turned on, the floating diffusion regions FD_A and FD_B may be reset to the pixel voltage VDD_px. The reset operation is performed to remove photocharges, which may act as noise, before a pixel signal is outputted, from the floating diffusion regions FD_A and FD_B.

In the fourth time period TP4, the banding switch control signals, BS_(k−1), BS_k and BS_(k+1), may correspond to logic low, the boosting voltage FDB_k may correspond to a high level, the transmission control signal TG_k and the reset control signal RG_k may correspond to logic low, and the selection control signal SEL_k may correspond to logic high. Therefore, the switch transistors, BSX_(k−1), BSX_k and BSX_(k+1), may be turned off, the boosting capacitors BC_A and BC_B may be in the boosting state, the transmission transistors TX_A and TX_B and the reset transistors RX_A and RX_B may be turned off, and the selection transistors SX_A and SX_B may be turned on.

As the boosting voltage FDB_k transitions to a high level, the voltage levels of the floating diffusion regions FD_A and FD_B follow the boosting voltage FDB_k (boosting operation) and increase to the high level. At this time, the slope at which the voltage levels of the floating diffusion regions FD_A and FD_B rise may be decided by a time constant based on the capacitances of the boosting capacitors BC_A and BC_B, and the length of the fourth time period TP4 may be previously decided so that the voltage levels of the floating diffusion regions FD_A and FD_B reach a predetermined level within the fourth time period TP4.

In some embodiments, a reference signal corresponding to the boosted voltage levels of the floating diffusion regions FD_A and FD_B, e.g., a signal irrelevant to the intensity of incident light, may be generated and outputted between the fourth and fifth time periods TP4 and TP5.

As illustrated in FIG. 4, while at least the boosting voltage FDB_k retains a low level, the switch transistors BSX_(k−1) and BSX_k may be turned off for normal pre-boosting and boosting operations.

In the fifth time period TP5, the banding switch control signals BS_(k−1), BS_k and BS_(k+1) may correspond to logic high, the boosting voltage FDB_k may correspond to a high level, the transmission control signal TG_k may correspond to logic high, the reset control signal RG_k may correspond to logic low, and the selection control signal SEL_k may correspond to logic high. Therefore, the switch transistors BSX_(k−1), BSX_k and BSX_(k+1) may be turned on, the boosting capacitors BC_A and BC_B may be in the boosting state, the transmission transistors TX_A and TX_B may be turned on, the reset transistors RX_A and RX_B may be turned off, and the selection transistors SX_A and SX_B may be turned on.

After the pre-boosting operation and the boosting operation using the boosting voltage FDB_k are completed (i.e. after the fourth time period TP4), the banding switch control signals BS_(k−1), BS_k and BS_(k+1) may transition to logic high, such that the $k^{th}$ signal line SL_k is coupled to the other signal lines. In the present embodiment, all of the banding switch control signals BS_(k−1), BS_k and BS_(k+1) transition to logic high such that all of the switch transistors BSX_(k−1), BSX_k and BSX_(k+1) are turned on. In some implementations, only any one of the switch transistors BSX_(k−1) and BSX_k which are directly coupled to the $k^{th}$ signal line SL_k may be turned on to couple the $k^{th}$ signal line SL_k to other signal lines.

As the transmission transistors TX_A and TX_B are turned on, the photo-charges accumulated in the photoelectric conversion elements PD_A and PD_B may be transferred to the floating diffusion regions FD_A and FD_B. According to the assumption of FIG. 3 that the light is incident on the pixel pk_I only and not incident on the pixel pk_(I+1), the photoelectric conversion element PD_A has photocharges generated and accumulated therein, and the photoelectric conversion element PD_B does not have any photocharges generated and accumulated therein. Therefore, the voltage level of the floating diffusion region FD_A should fall as the photocharges accumulated in the photoelectric conversion element PD_A are transferred, and the voltage level of the floating diffusion region FD_B should be retained as zero since the photoelectric conversion element PD_B has no photocharges accumulated therein.

Although there has no photocharges generated and accumulated in the photoelectric conversion element PD_B, if the switch transistors BSX_1 to BSX_(n−1) are not included in the pixel array 200, the voltage level of the floating diffusion region FD_B has a specific voltage level VL_CC instead of zero voltage level due to the capacitive coupling between the floating diffusion regions FD_A and FD_B.

In the present embodiment, however, when photocharges are transmitted from the photoelectric conversion elements PD_A and PD_B to the floating diffusion regions FD_A and FD_B, the switch transistors BSX_1 to BSX_(n−1) may be turned on to electrically couple the $k^{th}$ signal line SL_k to the other signal lines. Thus, noise components caused by the capacitive coupling between the floating diffusion regions FD_A and FD_B may be distributed through other signal lines. Therefore, the occurrence of banding noise can be minimized to retain the voltage level of the floating diffusion region FD_B.

Before the selection transistors SX_A and SX_B are turned off after the fifth time period TP5, an image signal corresponding to the voltage levels of the floating diffusion regions FD_A and FD_B (i.e. a signal corresponding to the intensity of incident light) may be generated and outputted.

In accordance with the present embodiment, the image sensing device can minimize banding noise using switch transistors that are disposed to be turned on and off between any two adjacent rows. The banding noise that is caused on a certain row can be transferred through a signal line coupled to pixels disposed on the certain row to other signal lines coupled to other rows, which results to minimize the banding noise.

While various embodiments have been described above, it will be understood that the embodiments described are examples only and various enhancements, modifications, variations and other embodiments may be made based on what is described and illustrated.

What is claimed is:

1. An image sensing device comprising:
    a pixel array including pixels arranged in rows and columns, the pixels including first pixels disposed on a first row that is disposed between a second row and a third row, and second pixels disposed on the second row and third pixels disposed on the third row;
    a first signal line coupled to the first pixels and configured to apply a boosting voltage to the first pixels;
    a second signal line coupled to the second pixels;
    a first switch transistor coupled between the first signal line and the second signal line and structured to be turned on to couple the first signal line to the second signal line; and
    a second switch transistor coupled between the first signal line and a third signal line coupled to the third pixels disposed on the third row and structured to be turned on to couple the first signal line to the third signal line.

2. The image sensing device of claim 1, wherein the first and second switch transistors are structured to be turned off when the boosting voltage transits from a first level to a second level higher than the first level.

3. The image sensing device of claim 1, wherein each of the first pixels comprises:
    a transmission transistor configured to transmit photocharges generated in a photoelectric conversion element to a floating diffusion region in response to a transmission control signal; and
    a boosting capacitor coupled between the floating diffusion region and the first signal line.

4. The image sensing device of claim 3, wherein at least one of the first and second switch transistors is structured to be turned on during a transmission of the photocharges by the transmission transistor.

5. The image sensing device of claim 3, wherein the boosting voltage transits from a second level to a first level lower than the second level during an accumulation of the photocharges in the photoelectric conversion element.

6. The image sensing device of claim 5, wherein while the boosting voltage has the first level, the first and second switch transistors are structured to be turned off.

7. The image sensing device of claim 5, wherein the floating diffusion region is structured to be reset to a supply voltage after a transition of the boosting voltage from the second level to the first level.

8. The image sensing device of claim 1, wherein the second switch transistor is disposed on a side of the first row.

9. The image sensing device of claim 1, wherein the first switch transistor and the second switch transistor are arranged to be adjacent to two different columns.

10. The image sensing device of claim 1, wherein the first switch transistor and the second switch transistor are arranged along one line.

11. The image sensing device of claim 1, wherein the first signal line is configured to apply the boosting voltage for adjusting the voltage levels of floating diffusion regions of the first pixels.

12. An image sensing device comprising:
    a plurality of pixels arranged in an n×m matrix where n and m are integers equal to or larger than 2, each pixel including a photoelectric conversion element structured to generate photocharges in response to light incident to the photoelectric conversion element and a floating diffusion region electrically coupled to the photoelectric conversion element and store the generated photocharges;
    a plurality of signal lines, each configured to apply a boosting voltage to corresponding pixels disposed on a corresponding row to raise voltage levels of floating diffusion regions of the corresponding pixels; and
    a plurality of switch transistors, each coupled between any two adjacent signal lines and structured to be turned on or off to transfer a noise component occurring on some pixels disposed on a corresponding row to another row.

13. The image sensing device of claim 12, wherein each of the plurality of pixels comprises:
    a transmission transistor configured to transmit photocharges generated in the photoelectric conversion element to the floating diffusion region in response to a transmission control signal; and
    a boosting capacitor coupled between the floating diffusion region and any one of the plurality of signal lines.

14. The image sensing device of claim 13, wherein, during a transfer of the photocharges from the photoelectric conversion element to the floating diffusion regions in pixels included in a $k^{th}$ row, one or more switch transistors coupled to a signal line corresponding to the $k^{th}$ row are turned on, where k is any one of 1 to n.

15. The image sensing device of claim 14, wherein, when the boosting voltage applied to the signal line corresponding to the $k^{th}$ row transits from a first level to a second level higher than the first level, a switch transistor coupled to the signal line corresponding to the $k^{th}$ row is turned off.

16. The image sensing device of claim 14, wherein, when the photocharges are transferred from the photoelectric conversion element to the floating diffusion regions in the pixels included in the $k^{th}$ row, one or more of the plurality of switch transistors are turned off.

17. The image sensing device of claim 12, wherein the plurality of switch transistors is arranged along one line.

18. The image sensing device of claim 12, wherein at least two of the plurality of switch transistors are arranged to be adjacent to two different columns.

* * * * *